United States Patent
Lallement et al.

(10) Patent No.: US 9,716,029 B2
(45) Date of Patent: Jul. 25, 2017

(54) METHOD FOR TRANSFERRING A LAYER OF A SEMICONDUCTOR AND SUBSTRATE COMPRISING A CONFINEMENT STRUCTURE

(75) Inventors: Fabrice Lallement, Bernin (FR); Christophe Figuet, Crolles (FR); Daniel Delprat, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/127,926

(22) PCT Filed: Jun. 20, 2012

(86) PCT No.: PCT/EP2012/061848
§ 371 (c)(1),
(2), (4) Date: Dec. 19, 2013

(87) PCT Pub. No.: WO2012/175561
PCT Pub. Date: Dec. 27, 2012

(65) Prior Publication Data
US 2014/0183601 A1    Jul. 3, 2014

(30) Foreign Application Priority Data

Jun. 23, 2011    (FR) ..................................... 11 55577

(51) Int. Cl.
*H01L 21/30* (2006.01)
*H01L 21/70* (2006.01)
(Continued)

(52) U.S. Cl.
CPC ...... *H01L 21/76254* (2013.01); *H01L 29/267* (2013.01)

(58) Field of Classification Search
CPC ......... H01L 21/28518; H01L 29/78687; H01L 21/76256; H01L 21/76259;
(Continued)

(56) References Cited

U.S. PATENT DOCUMENTS

| | | | |
|---|---|---|---|
| 6,107,653 A | 8/2000 | Fitzgerald | |
| 6,291,321 B1 | 9/2001 | Fitzgerald | |

(Continued)

FOREIGN PATENT DOCUMENTS

| | | |
|---|---|---|
| EP | 2333824 A1 | 6/2011 |
| WO | WO 2004021420 A2 | 3/2004 |

OTHER PUBLICATIONS

International Search Report, PCT/EP2012/061848, mailed Sep. 28, 2012.
(Continued)

*Primary Examiner* — Kimberly Rizkallah
*Assistant Examiner* — Brian Turner
(74) *Attorney, Agent, or Firm* — TraskBritt

(57) ABSTRACT

A method for transferring a layer of semiconductor by providing a donor substrate that includes a useful layer of a semiconductor material, a confinement structure that includes a confinement layer of a semiconductor material having a chemical composition that is different than that of the useful layer, and two protective layers of semiconductor material that are distinct from the confinement layer with the protective layers being arranged on both sides of the confinement layer; introducing ions into a donor substrate, bonding the donor substrate to a receiver substrate, subjecting the donor and receiver substrates to a heat treatment that provides an increase in temperature during which the confinement layer attracts the ions in order to concentrate them in the confinement layer, and detaching the donor substrate from the receiver substrate by breaking the confinement layer.

16 Claims, 5 Drawing Sheets

(51) Int. Cl.
*H01L 21/762* (2006.01)
*H01L 21/46* (2006.01)
*H01L 21/304* (2006.01)
*H01L 21/322* (2006.01)
*H01L 29/267* (2006.01)

(58) Field of Classification Search
CPC ............... H01L 21/76264; H01L 21/84; H01L 27/1203; H01L 29/41783; H01L 29/66242; H01L 29/66628; H01L 29/66772; H01L 29/66916; H01L 29/7842; H01L 29/7849; H01L 29/786
USPC .................. 257/191, 200, E21.122, E29.091; 438/458, 459, 68
See application file for complete search history.

(56) References Cited

U.S. PATENT DOCUMENTS

| | | | |
|---|---|---|---|
| 6,876,010 | B1 | 4/2005 | Fitzgerald |
| 8,163,581 | B1* | 4/2012 | Or-Bach et al. ............... 438/39 |
| 2002/0084000 | A1 | 7/2002 | Fitzgerald |
| 2003/0203600 | A1* | 10/2003 | Chu et al. ..................... 438/479 |
| 2004/0005740 | A1 | 1/2004 | Lochtefeld et al. |
| 2004/0053477 | A1* | 3/2004 | Ghyselen et al. ............ 438/465 |
| 2004/0137698 | A1 | 7/2004 | Taraschi et al. |
| 2004/0262631 | A1 | 12/2004 | Fitzgerald |
| 2005/0104067 | A1* | 5/2005 | Chu .................. H01L 21/76256 257/66 |
| 2005/0189563 | A1 | 9/2005 | Lochtefeld et al. |
| 2005/0199954 | A1 | 9/2005 | Lochtefeld et al. |
| 2005/0205934 | A1 | 9/2005 | Lochtefeld et al. |
| 2005/0212061 | A1 | 9/2005 | Langdo et al. |
| 2005/0218453 | A1 | 10/2005 | Langdo et al. |
| 2006/0073674 | A1* | 4/2006 | Fitzgerald et al. ........... 438/458 |
| 2006/0185582 | A1* | 8/2006 | Atwater, Jr. ............ C30B 33/06 117/89 |
| 2006/0255341 | A1 | 11/2006 | Pinnington et al. |
| 2008/0128751 | A1 | 6/2008 | Langdo et al. |
| 2008/0160661 | A1* | 7/2008 | Henley .......................... 438/68 |
| 2011/0073908 | A1 | 3/2011 | Lochtefeld et al. |
| 2011/0140230 | A1 | 6/2011 | Daval et al. |
| 2011/0318893 | A1 | 12/2011 | Lochtefeld et al. |
| 2012/0129324 | A1* | 5/2012 | Cherekdjian ................. 438/513 |

OTHER PUBLICATIONS

International Written Opinion of International Application No. PCT/EP2012/061848, dated Sep. 28, 2012, 6 pages.
International Preliminary Report on Patentability for International Application No. PCT/EP2012/061848, dated Dec. 23, 2012, 1 page.

* cited by examiner

METHOD FOR TRANSFERRING A LAYER OF A SEMICONDUCTOR AND SUBSTRATE COMPRISING A CONFINEMENT STRUCTURE

This application is a national phase entry under 35 U.S.C. §371 of International Patent Application PCT/EP2012/061848, filed Jun. 20, 2012, which claims priority to French Application No. 11-55577, filed Jun. 23, 2011.

TECHNICAL FIELD

The invention relates to a method for manufacturing a semiconductor substrate, and to a semiconductor substrate.

BACKGROUND

Silicon-on-insulator (SOI) substrates are widely used in the microelectronics industry.

One known method of the state of the art for transferring a layer of silicon from a donor substrate to a receiver substrate consists in forming an embrittlement zone in the donor substrate, bonding the donor substrate and the receiver substrate, and then detaching the donor substrate from the receiver substrate by breaking at the embrittlement zone, notably via a suitable heat treatment.

However, breaking induces defects that can be more or less extensive in the receiver substrate and/or the donor substrate.

For example, in the case of a post-breaking substrate implanted with hydrogen ions, roughness of several tens of angstroms (50-80 angstroms RMS) is obtained.

Consequently, to manufacture substrates in which an ultrathin layer of silicon is necessary (roughly 12 nm), for example, fully-depleted silicon-on-insulator (FD-SOI) substrates, it is necessary to transfer a thickness of about 200 nm to 250 nm of silicon, insofar as a large thickness is consumed in surface-smoothing processes.

The invention, thus, proposes to mitigate, at least in part, the disadvantages of the state of the art.

BRIEF SUMMARY

The invention proposes a method for transferring a layer of semiconductor, characterized in that the method comprises the steps consisting in:

providing a donor substrate comprising a useful layer composed of a semiconductor material, and a confinement structure, comprising a confinement layer, consisting of a semiconductor material, the confinement layer with a chemical composition different than the useful layer, and two protective layers of semiconductor material, and with a chemical composition distinct from the confinement layer, the protective layers being arranged on both sides of the confinement layer, providing a receiver substrate, introducing ions in the donor substrate, bonding the donor substrate and the receiver substrate, subjecting the donor substrate and the receiver substrate to a heat treatment comprising an increase in temperature, during which the confinement layer attracts the ions in order to concentrate them in the confinement layer, and detaching the donor substrate from the receiver substrate by breaking at the confinement layer, to transfer at least part of the useful layer to the receiver substrate, the protective layers being capable of confining in the confinement structure defects that appear following breaking at the confinement layer.

The invention is advantageously supplemented by the following characteristics, taken alone or in any technically possible combination:

the protective layers are arranged in contact with and on both sides of the confinement layer;

the protective layers are arranged at a distance from and on both sides of the confinement layer, the protective layers being separated from the confinement layer by separation layers whose thickness is adapted in relation to an ion introduction profile, in such a way that the concentration of ions trapped at each interface between the protective layers and the separation layers remains below a critical concentration beyond which a break is likely to be initiated during the heat treatment and/or detachment step;

during the heat treatment, the protective layers also attract ions to the confinement layer;

a protective layer, in contact with the useful layer, consists of a material enabling selective chemical etching of the protective layer with respect to the useful layer, the method comprising a step consisting in selectively etching the protective layer, after detachment of the donor substrate from the receiver substrate by breaking;

the donor substrate comprises a support layer in contact with the confinement structure, and the protective layer in contact with the support layer consists of a material enabling selective chemical etching of the protective layer with respect to the support layer, the method comprising a step consisting in selectively etching the protective layer present on the donor substrate after breaking;

ions are introduced in the donor substrate by immersion of the donor substrate in plasma comprising the ions;

ions are introduced in the donor substrate by implantation of the ions;

the confinement layer consists of boron-doped silicon, and the ions are introduced in the donor substrate in a dose between $5 \times 10^{15}$ and $4 \times 10^{16}$ atoms/cm$^2$;

the method comprises the step consisting in transferring a useful layer, of thickness between 10 nm and 100 nm, from the donor substrate to the receiver substrate;

the donor substrate consists of a plurality of stacked layers, each stack comprising a useful layer composed of a semiconductor material, and a confinement structure, the method comprising the step consisting in transferring successively at least part of each useful layer to a receiver substrate, in accordance with the steps of the method;

the protective layers consist of $Si_{(1-x)}Ge_x$, and the confinement layer consists of $Si_{(1-y)}Ge_y$, the difference between x and y being greater than or equal to 3%, or boron-doped SiGe, or boron-doped silicon;

the protective layers consist of SiGe and the confinement layer consists of boron-doped SiC;

the protective layers consist of SiGe and the confinement layer consists of boron-doped Ge;

the protective layers consist of InGaN and the confinement layer consists of a GaN and Si alloy;

the protective layers consist of AlGaN and the confinement layer consists of undoped or Si- or Mg-doped InGaN.

The invention also relates to a semiconductor substrate, characterized in that the substrate comprises:

a useful layer composed of a semiconductor material, and a confinement structure, comprising a confinement layer, consisting of a semiconductor material, the confinement layer with a chemical composition different than the useful layer, and two protective layers of semiconductor material distinct from material of the confinement layer, the protective layers being arranged in contact with and on both sides of the confinement layer, the confinement layer being adapted to attract ions introduced in the substrate to the confinement layer, during a heat treatment for rising temperature of the substrate in order to create a break at the confinement layer, and the protective layers being capable of confining in the confinement structure defects that appear following breaking at the confinement layer.

The substrate is advantageously supplemented by the following characteristics, taken alone or in any technically possible combination:

the protective layers are also adapted to attract ions to the confinement layer during heat treatment of the substrate;

a protective layer, in contact with the useful layer, consists of a material enabling selective chemical etching of the protective layer with respect to the useful layer;

a support layer in contact with the confinement structure, and the protective layer in contact with the support layer consists of a material enabling selective chemical etching of the protective layer with respect to the support layer;

the protective layers consist of $Si_{(1-x)}Ge_x$, and the confinement layer consists of $Si_{(1-y)}Ge_y$, the difference between x and y being greater than or equal to 3%, or boron-doped SiGe, or boron-doped silicon;

the protective layers consist of SiGe and the confinement layer consists of boron-doped SiC;

the protective layers consist of SiGe and the confinement layer consists of boron-doped Ge;

the protective layers consist of InGaN and the confinement layer consists of a GaN and Si alloy;

the protective layers consist of AlGaN and the confinement layer consists of undoped or Si- or Mg-doped InGaN;

the protective layers are arranged in contact with and on both sides of the confinement layer, or the protective layers are arranged at a distance from and on both sides of the confinement layer, the protective layers being separated from the confinement layer by separation layers.

The invention has many advantages.

The invention makes it possible to transfer useful layers with reduced roughness.

Moreover, the invention makes it possible to transfer thin layers of a donor substrate to a receiver substrate.

Moreover, the invention makes it possible to facilitate the finishing of the donor substrate and/or the receiver substrate.

Lastly, the invention applies to the transfer of a wide variety of useful layers, notably stressed useful layers.

BRIEF DESCRIPTION OF THE DRAWINGS

Other characteristics, aims and advantages of the invention will become apparent from the following description, which is purely illustrative and nonrestrictive, and which must be considered in relation to the accompanying drawings wherein.

DETAILED DESCRIPTION

Figure 1:
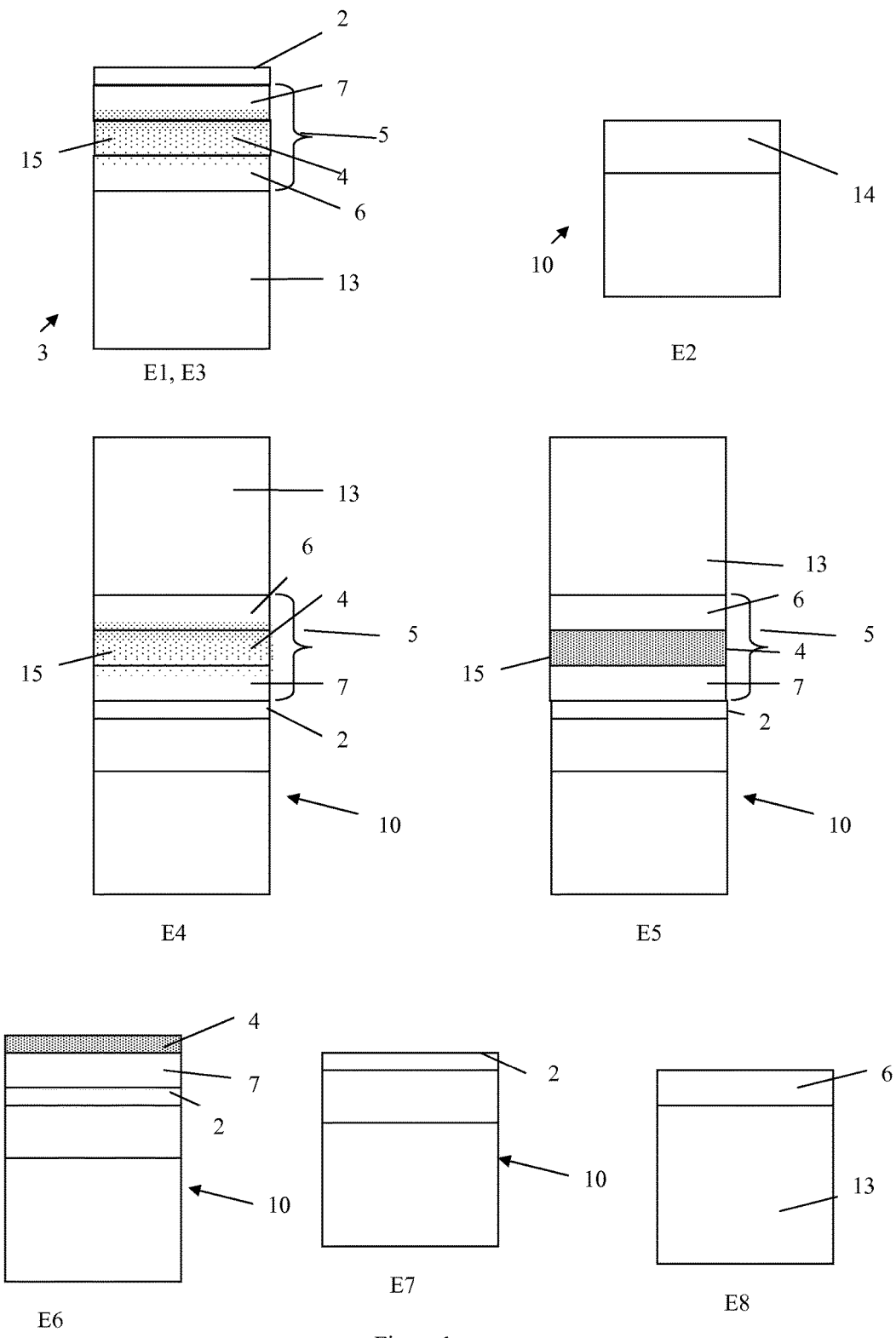
FIG. 1 is a representation of one embodiment of the inventive transfer method.
Figure 2:
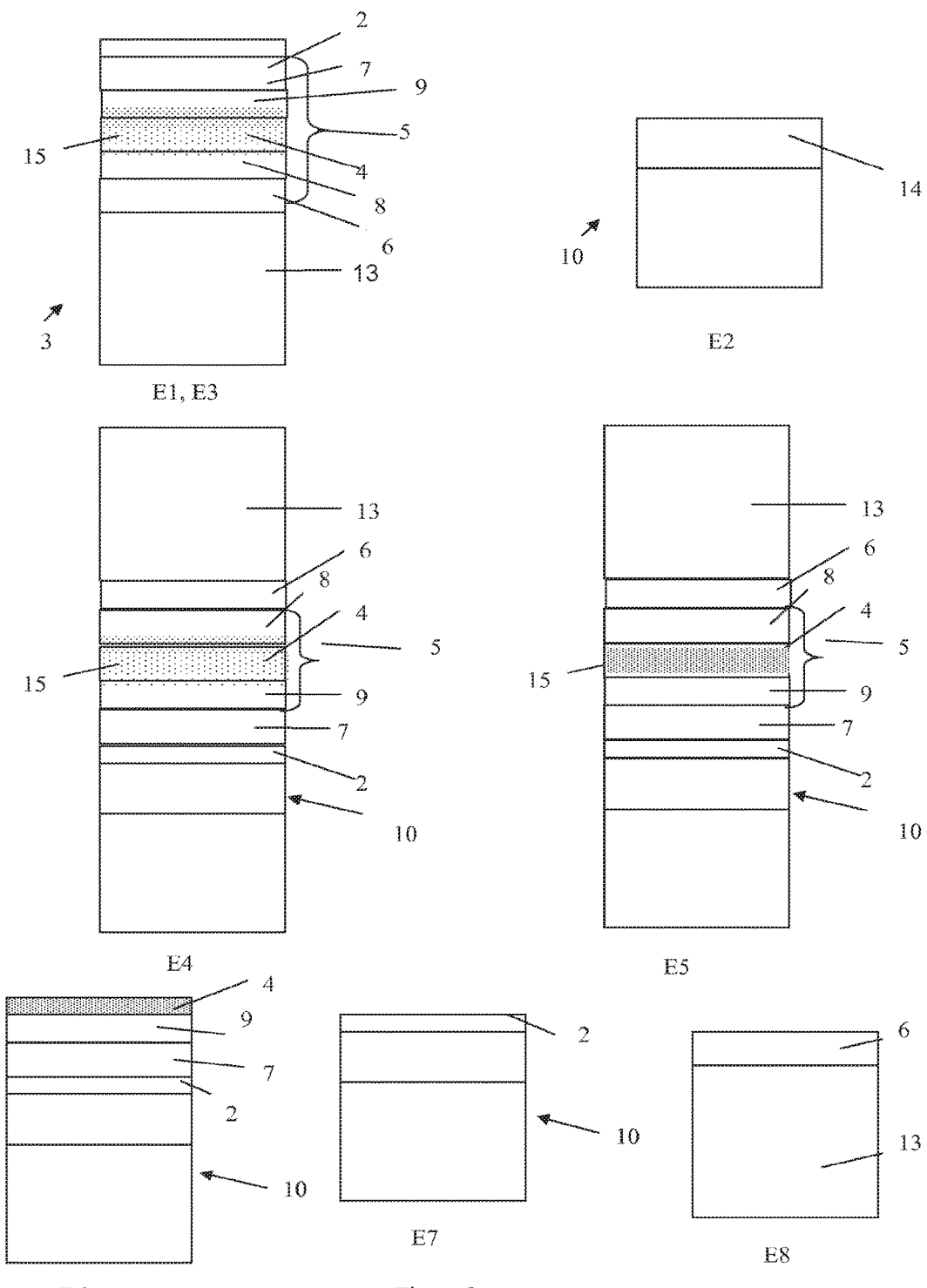
FIG. 2 is a representation of another embodiment of the inventive transfer method.

FIGS. 1 and 2 represent embodiments of a transfer method of the invention.

The method comprises a step E1 consisting in providing a donor substrate 3 comprising a useful layer 2 composed of a semiconductor material, and a confinement structure 5.

The useful layer 2 is, for example, but in a nonrestrictive manner, made of silicon or germanium. The useful layer 2 is in general selected as a function of the desired applications.

The confinement structure 5 comprises a confinement layer 4, consisting of a semiconductor material.

The confinement layer 4 has a different chemical composition than the useful layer 2. The expression "different chemical composition" refers to the fact that:

the useful layer 2 and the confinement layer 4 are made up of different materials, or the same material but with different proportions of chemical elements (SiGe with different proportions of germanium, for example), the useful layer 2 and the confinement layer 4 are doped with different dopant species.

The confinement structure 5 further comprises two protective layers 6, 7 of semiconductor material distinct from material of the confinement layer 4. The protective layers 6, 7 are arranged on both sides of the confinement layer 4.

The protective layers 6, 7 can be arranged in contact with the confinement layer 4 or, alternatively, can be arranged at a distance from the confinement layer 4.

In FIG. 1, the protective layers 6, 7 are arranged in contact with the confinement layer 4.

In FIG. 2, the protective layers 6, 7 are arranged at a distance from the confinement layer 4. The protective layers 6, 7 are separated from the confinement layer 4 by separation layers 8, 9. These separation layers 8, 9 are of semiconductor material formed by epitaxy, such as, for example, but in a nonrestrictive manner: Si, Ge, SiGe and III-V materials such as GaN, GaAs or InP. The separation layers 8, 9 do not necessarily share the same chemical composition, but have a chemical composition different than the confinement layer 4 and the protective layers 6, 7.

The protective layers 6, 7 have a semiconductor material distinct from material of the confinement layer 4 (different chemical composition: different materials, different proportions of chemical elements or different doping in terms from dopant species).

The protective layers 6, 7 can have several functions, detailed below.

The protective layers 6, 7 may or may not share the same chemical composition.

The confinement structure 5 is in general fabricated by epitaxial growth. Epitaxy makes it possible to precisely control the thickness, and to obtain small thicknesses, of the confinement layer 4.

The confinement structure 5 can be placed at various locations within the donor substrate 3, for example, under the useful layer 2, or in the useful layer 2, or in another layer of the donor substrate 3.

The method comprises a step E2 consisting in providing a receiver substrate 10. The receiver substrate 10 advantageously comprises an oxide layer 14. This is useful, for example, when the fabrication of a silicon-on-insulator (SOI) substrate is intended. Alternatively, or in addition, a donor substrate 3 comprising an oxide coating can be used. This oxide coating can be deposited on the useful layer 2 of the donor substrate 3.

The method comprises a step E3 consisting in introducing ions 15 in the donor substrate 3.

The ions are advantageously hydrogen ions, or helium ions, or a combination of the ions. If the confinement layer 4 consists of boron-doped silicon, it is advantageous to introduce hydrogen ions.

The method, thus, comprises a step E4 consisting in bonding the donor substrate 3 and the receiver substrate 10.

Bonding is in general carried out by bringing together the free sides of the substrates 3, 10, which ensures bonding by molecular adhesion. The free sides of the substrates 3, 10 are in general cleaned beforehand to promote bonding.

The method comprises a step E5 consisting in subjecting the donor substrate 3 and the receiver substrate 10 to a heat treatment comprising an increase in temperature, during which the confinement layer 4 attracts ions 15 to concentrate them in the confinement layer 4.

Typical heat treatment temperatures are between 200° C. and 700° C.

Thus, during heat treatment of the donor substrate and the receiver substrate, the confinement layer attracts the ions to concentrate them in the confinement layer.

Figure 4:
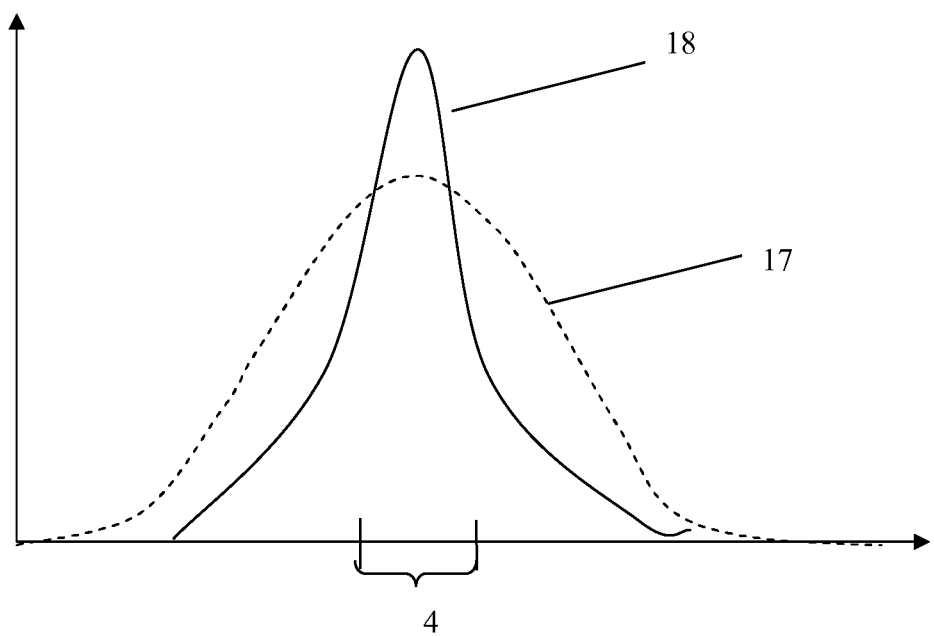
FIG. 4 is a representation of ion concentration in a donor substrate, before and after a heat treatment.

This is illustrated in FIG. 4, which presents the ion concentration profile in the donor substrate as a function of depth, before (curve 17) and after (curve 18) heat treatment. The peak of the latter curve 18 illustrates the preferential migration of ions 15 to the confinement layer 4.

Another function of this heat treatment can be to increase the bonding energy between the donor substrate and the receiver substrate.

The heat treatment is carried out so that different effects are produced:

the bonding energy between the donor substrate and the receiver substrate is increased, the ions concentrate in the confinement layer until a critical concentration is reached, these ions create cavities, which will coalesce, the pressure in these cavities increases until a break is caused in the confinement layer, which makes it possible to separate the donor substrate from the receiver substrate.

These four effects can be obtained during a single thermal annealing, or during separate individual thermal annealings.

The step following the heat treatment is a step E6 consisting in detaching the donor substrate 3 from the receiver substrate 10 by breaking at the confinement layer 4, to transfer at least part of the useful layer 2 to the receiver substrate 10.

It has been discovered that the ions, introduced during the third step E3, have the occasional tendency to be trapped at the interfaces between the confinement layer 4 and the protective layers 6, 7, because of the lattice mismatch between these layers.

However, such ion trapping may prove detrimental, because it is likely to lead to undesired detachments at these interfaces, during the heat treatment and/or detachment step.

In the embodiment of FIG. 2, the separation layers 8, 9 are present between the confinement layer 4 and the protective layers 6, 7. By virtue of these separation layers 8, 9, ion introduction is carried out at a distance from the protective layers 6, 7, which reduces the risk of ion segregation in these protective layers 6, 7. Consequently, any undesirable detachment inside the protective layers 6, 7 is avoided.

In particular, the thickness of the separation layers 8, 9 is adapted relative to the ion introduction profile, so that the ions introduced and trapped at the interface between the protective layers 6, 7 and the separation layers 8, 9 are negligible (some trapping remains, but in an insignificant manner, due to distancing with respect to the implantation peak). The introduction profile is in general an implantation profile, when the ions are introduced by implantation into the substrate, which enables better control of the ion introduction profile.

Thus, the thickness of the separation layers 8, 9 is adapted relative to the ion introduction profile, so that the concentration of ions trapped at each interface between the protective layers 6, 7 and the separation layers 8, 9 remains below a critical concentration beyond which a breaking wave front is likely to be initiated during the heat treatment and/or detachment step.

In the case of hydrogen ions, this critical concentration is roughly equal to $10^{21}$ atoms/cm$^3$. This concentration is notably to be adjusted as a function of the ions introduced.

At the end of the sixth step E6, the receiver substrate 10 and the donor substrate can undergo a finishing process (cleaning, polishing, etching) to remove the remainder of undesirable layers (steps E7/E8).

The protective layers 6, 7 are capable of confining in the confinement structure 5 defects that appear following a break at the confinement layer 4.

Thus, these layers advantageously play the role of shield around the confinement layer 4, by their presence around the confinement layer 4. Damage is, thus, avoided to the layers located on each side of the confinement structure 5, and in particular to the useful layer 2.

Figure 3:
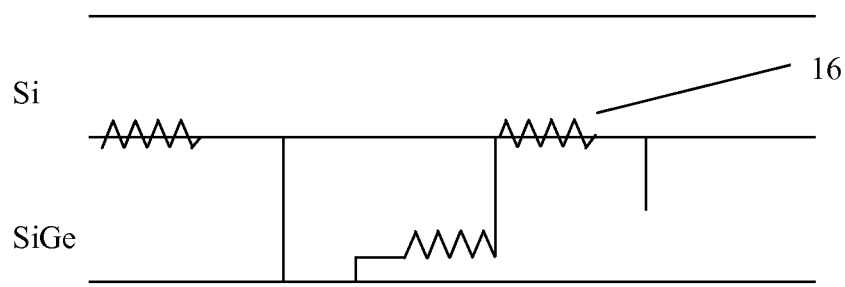
FIG. 3 is a representation of defects generated in the prior art following a detachment break.

Indeed, the break obtained in the confinement layer 4 following the heat treatment is likely to lead to the propagation of defects toward the useful layer 2. This is illustrated in FIG. 3, in the case in which no protective layer is used. Here, the useful layer 2 is of Si and the confinement layer 4 of SiGe.

As can be noted, the break profile 16 has defects that leave undesirable marks in the useful layer 2. This is avoided in the invention by virtue of the protective layers 6, 7.

Figure 7:
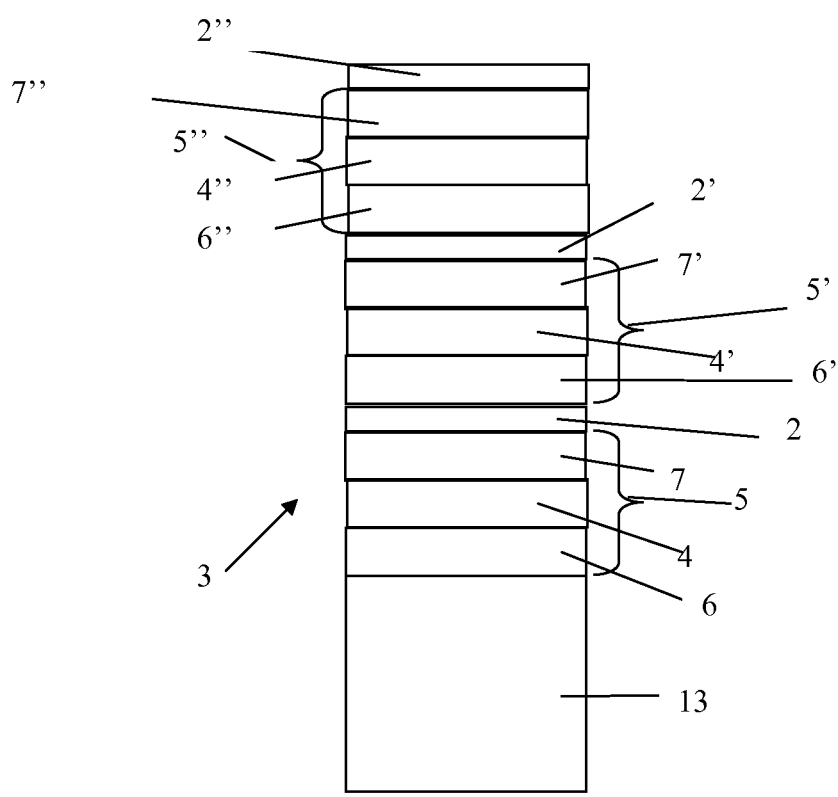
FIG. 7 is a representation of a substrate suitable for multiple transfers of useful layers.

The protective layer 6, which also takes part in confining defects resulting from the break in the confinement structure 5, makes it further possible to avoid the propagation of defects toward another useful layer, such as that illustrated in FIG. 7 (the useful layer 2', located under the protective layer 6"), in the case in which several confinement structures and several useful layers are stacked, notably in view of multiple transfers of useful layers.

Thus, the protective layers make it possible to confine, in the confinement structure 5, defects that appear following a break at the confinement layer 4.

The Applicant has noted that the use of confinement layer 4 made of boron-doped silicon enables optimal confinement of the defects in the confinement structure 5.

The invention, thus, proposes a semiconductor substrate comprising:

the useful layer 2 composed of a semiconductor material, and the confinement structure 5, comprising:

the confinement layer 4, consisting of a semiconductor material, the confinement layer 4 with a chemical composition different than the useful layer 2, and two protective layers 6, 7 of semiconductor material distinct from material of the confinement layer 4, the protective layers 6, 7 being arranged on both sides of the confinement layer 4, in contact with the confinement layer 4, or at a distance from the confinement layer 4, being separated by the separation layers 8, 9; the confinement layer 4 being adapted to attract ions 15 introduced in the substrate toward the confinement layer 4, during heat treatment for rising temperature of the substrate in order to create a break at the confinement layer 4, and the protective layers 6, 7 being capable of confining in the confinement structure 5 defects that appear following a break at the confinement layer 4.

Various materials can be used for the confinement layer 4 and the protective layers 6, 7.

Example embodiments notably include, but in a nonrestrictive manner, the following cases:

protective layer material: $Si_{(1-x)}Ge_x$ (x between 0 and 1), confinement layer material: $Si_{(1-y)}Ge_y$ (the difference between x and y is at least 3%, preferably greater than 5%, even 10%), or doped SiGe (with boron, for example), or silicon doped, for example, with boron. A particular case is the case where the protective layers are of SiGe and the confinement layer is of boron-doped silicon.

Furthermore, mention may be made of the case in which the protective layers consist of SiGe and the confinement layer consists of boron-doped Ge. Example embodiments are as follows:

protective layer material: silicon, confinement layer material: $Si_{(1-y)}Ge_y$, or doped SiGe (with boron, for example) or doped silicon (with boron, for example);

protective layer material: germanium, confinement layer material: doped SiGe (with boron, for example), or doped silicon (with boron, for example), or doped germanium (with boron, for example), or SiGe;

protective layer material: SiGe, confinement layer material: doped SiC (with boron, for example);

protective layer material: AlGaN, confinement layer material: doped InGaN (for example, with Si, Mg), or undoped;

protective layer material: AlGaN or InGaN, confinement layer material: doped GaN (for example, Si, Mg), or undoped;

protective layer material: AlGaAs, confinement layer material: doped InGaAs (for example, Si, Zn, S, Sn) or undoped;

protective layer material: InGaN, and confinement layer material: alloy of GaN and Si.

In these example embodiments, the useful layer 2 is, for example, but in a nonrestrictive manner, made of silicon, or germanium.

The confinement layer 4 can in certain cases also be doped with antimony or arsenic.

The attraction of ions by the confinement layer 4 is notably related to a chemical attraction effect between the dopant species of the confinement layer 4 and the ions 15 introduced in the substrate. It is, thus, attraction by chemical affinity.

Another factor is related to the difference in stress (lattice parameter value) between the confinement layer 4 and the useful layer 2, which is due to the fact that the confinement layer 4 and the useful layer 2 consist of different materials, or of materials with different chemical proportions. It can also be a case in which the lattice parameter of the confinement layer is higher, or lower (difference in tension or compression stress).

For example, a confinement layer 4 of SiGe can be used in combination with a useful layer 2 of silicon.

For example, if the confinement layer consists of boron-doped silicon, and if the ions introduced in the donor substrate are hydrogen ions, the chemical interactions between boron and hydrogen notably will make it possible to attract the hydrogen ions in the confinement layer.

Thus, during heat treatment of the donor substrate and the receiver substrate, the confinement layer attracts the ions to concentrate the ions in the confinement layer.

The protective layers 6, 7 can also have another function. Generally, the protective layers 6, 7 can fill a single function among those described, or a plurality of these functions. This depends notably on the chemical composition of these protective layers.

In one embodiment, during heat treatment, the protective layers 6, 7 also attract ions 15 to the confinement layer 4. In this case, there is a joint effect of attraction of ions 15 by the confinement layer 4 and the protective layers 6, 7, which migrate preferentially to the confinement layer 4 during heat treatment. Mention may be made, for example, of the case of protective layers 6, 7 of doped or undoped SiGe, which take part in the attraction of hydrogen ions 15 to the confinement layer 4.

In one embodiment, a protective layer 7, in contact with the useful layer 2, consists of a material enabling selective chemical etching of the protective layer 7 with respect to the useful layer 2. It can involve selective chemical etching alone or accompanied by a mechanical process (chemical-mechanical planarization (CMP), for example).

In this case, the material of the protective layer 7 is selected as a function of the material of the useful layer 2 to enable selective chemical etching.

A judicious choice of protective layer material makes it possible to optimize chemical etching selectivity.

For example, if the useful layer 2 is made of silicon, a protective layer 7 of SiGe can be chosen, with a proportion of Ge greater than roughly 10%, which makes it possible to achieve a selectivity greater than roughly 10. By increasing the proportion of Ge, selectivity is increased (for example, selectivity of roughly 140 with 40% Ge).

The method, thus, comprises a step consisting in selectively etching (step E7) the protective layer 7, after detachment of the donor substrate 3 from the receiver substrate 10 by breaking. Beforehand, the remainder of the confinement layer 4 present on the receiver substrate 10 is removed, for example, by etching, as well as, if need be, the separation layer 9.

In general, the protective layer 7 is a sacrificial layer during selective etching.

Selective etching, thus, stops at the zone located between the protective layer 7 and the useful layer 2, after elimination of the protective layer 7.

As an example, the protective layer 7 is of SiGe and the useful layer 2 is of silicon.

Alternatively, it is possible to remove the protective layer 7 by nonselective etching. The protective layer 7 is in this case also sacrificial.

Alternatively, or in complement, the donor substrate 3 comprises a support layer 13 in contact with the confinement structure 5, and the protective layer 6 in contact with the support layer 13 consists of a material enabling selective chemical etching of the protective layer 6 with respect to the support layer 13. It can be selective chemical etching alone or accompanied by a mechanical process (CMP, for example).

In this case, the method comprises a step E8 consisting in selectively etching the protective layer 6 present on the donor substrate 3 after breaking (and also the separation layer 8 in the case of the embodiment of FIG. 2).

In general, the protective layer 6 is a sacrificial layer during selective etching.

Selective etching, thus, stops at the zone located between the protective layer 6 and the support layer 13.

As an example, the support layer 13 is made of silicon (for example, a solid silicon substrate) and the protective layer 6 is of SiGe. In another example, the support layer 13 is made of germanium, possibly combined with sapphire.

The protective layers 6, 7 are in general selected not to prevent or reduce ion attraction by the confinement layer 4, in order not to disturb confinement.

In the case in which the protective layers 6, 7 are made of SiGe, in order to enable selective etching as described above, the thickness of these layers 6, 7 is, for example, between several nanometers and several tens of nanometers. The proportion of Ge is advantageously between 5% and 50%.

Advantageously, a protective layer is used whose material has a concentration in elements that varies as a function of depth in the protective layers 6, 7.

Thus, the concentration (for example, of Ge) can be higher in part of the protective layer (6 or 7) where selective etching stops, and lower in the rest of the layer. This makes it possible to avoid relaxation of the layer, while making the protective layer thicker.

The introduction of ions 15 in the donor substrate 3 can be carried out according to various techniques.

Advantageously, the introduction of ions 15 in the donor substrate 3 is carried out by diffusion of ions 15 in the donor substrate 3 following immersion of the donor substrate 3 in a plasma containing the ions 15.

It is specified that this introduction of ions 15 in the donor substrate 3 can be implemented by techniques other than diffusion, for example, by implantation.

In the case of implantation, the ions are accelerated in the direction of the surface of the donor substrate. The average penetration depth of the atoms is in general between 100 Å and 1 μm, this depth being determined as a function of the species implanted and of implantation energy. In the case of implantation, doping exhibits an implantation peak in the donor substrate. The implanted ions have an energy selected to enable them to pass through the donor substrate material. The implantation peak depends on ion energy.

An advantage of implantation is that the implantation dose required is low (for example, on the order of $2 \times 10^{16}$ atoms/cm² for hydrogen).

In the case of ion diffusion by immersion in plasma, the donor substrate 3 plunged into plasma is subjected to electric pulses. The positive ions present in the plasma are then accelerated toward the surface of the substrate where they are introduced. As plasma surrounds the substrate, the entire surface receives ions at the same time.

Figure 5:
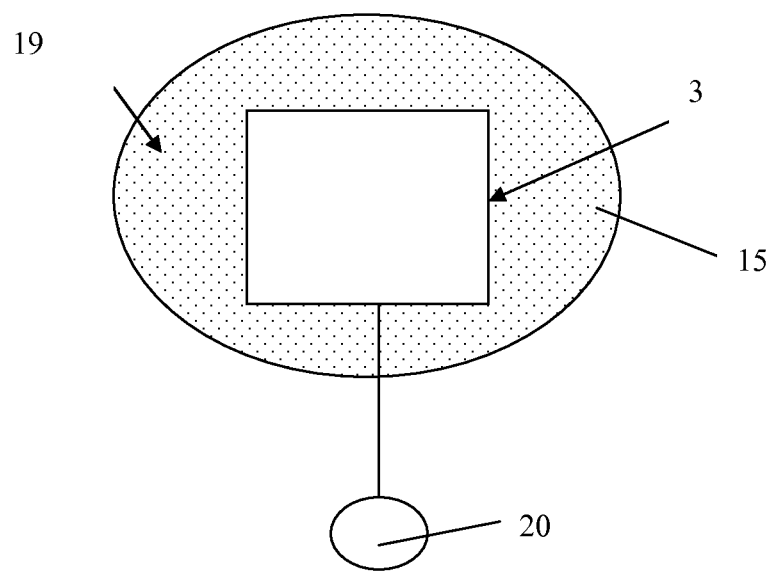
FIG. 5 is a representation of the introduction of ions into a donor substrate by plasma diffusion.

This diffusion of ions in plasma 19, comprising the ions 15, is illustrated in FIG. 5, wherein the donor substrate 3 receives electric pulses from the electric source 20.

Another advantage of this ion introduction is its ability to be applied on an industrial scale, as well as reduced implementation time.

Another advantage of this ion introduction is that the ion diffusion zone in the donor substrate is highly concentrated, on the order of several nanometers in thickness in the normal direction of the principal sides of the substrate (for example, between 10 nm and 200 nm).

The introduction of ions by plasma diffusion, thus, makes it possible to obtain satisfactory results in the transfer step, insofar as this technique notably makes it possible to enrich the donor substrate 1 in low-energy ions (a few hundred eV to several tens of keV), and in a high dose (several $10^{15}$ atoms/cm² to several $10^{17}$ atoms/cm²) in an area low depth (from several tens of nanometers to roughly 200 nanometers), which is not always accessible by an implantation technique. This is advantageous for subsequently transferring thin layers of the useful layer 2 to be transferred. Moreover, this is advantageous for reducing defects and roughness present in the transferred useful layer 2.

Indeed, even when the area is accessible by implantation, the high ion energy in the implantation method can lead to the introduction of crystal defects in the useful layer 2 to be transferred.

Figure 6:
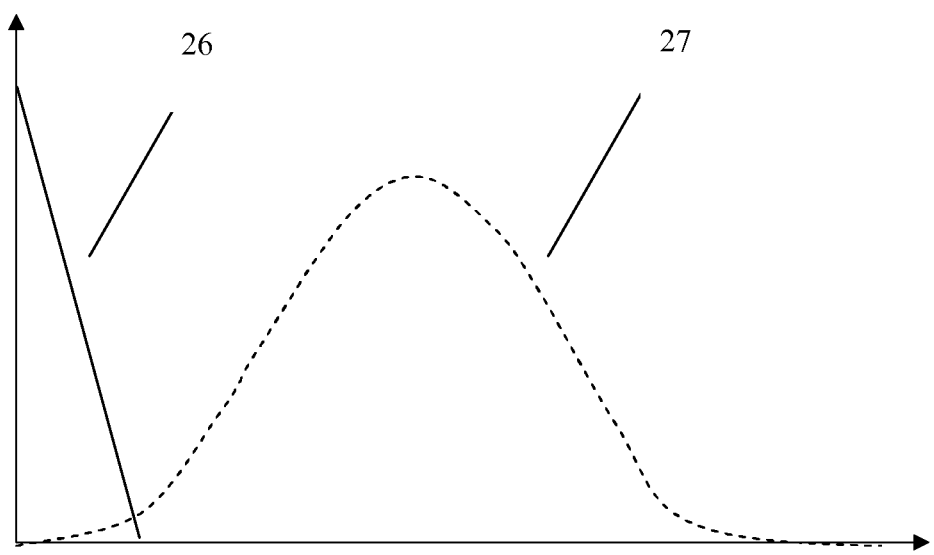
FIG. 6 is a representation of a method for introducing ions into a donor substrate by plasma diffusion.

FIG. 6 illustrates the ion concentration profile 15 in the donor substrate 3 as a function of depth in the donor substrate 3, before heat treatment, in the case of diffusion (curve 26), and in the case of ion implantation (curve 27).

In addition, in the case of a method of immersing the donor substrate 3 in a plasma at a low voltage (several hundred volts, or several keV), with diffusion of the implanted species (heating of the support), fewer defects are introduced than in the case of standard ion implantation. This approach can comprise hydrogenation (introduction of hydrogen on the surface) and a diffusion step.

One advantage of the transfer method implementing the constitution of a confinement structure comprising a confinement layer is that the break is highly localized, and occurs only or almost only at the confinement layer.

Typically, atomic force microscopy (AFM) post-break roughness of the useful layer obtained without the confinement structure is about 3 nm to 6 nm, whereas the confinement structure makes it possible to reduce this roughness to values of about 0.5 nm to 1 nm.

Thus, by locating the break in the confinement layer, and by confining in the confinement structure the defects resulting from the break, post-break roughness is reduced.

Indeed, in the case of standard transfer by ion implantation and breaking at an embrittlement zone without the use of a confinement structure, it is common for defects to appear in the substrate after breaking. This is notably due to the extended presence of ions in the substrate, which induces a relatively non-localized break, and, thus, greater roughness.

The useful semiconductor layer 2 transferred in accordance with the present method, thus, has reduced roughness. For example, in the case of a donor substrate 3 comprising a useful layer 2 to be transferred and a confinement structure 5 comprising a confinement layer 4 made of boron-doped silicon, a roughness of the transferred silicon layer of 5 Å RMS can be obtained.

Moreover, it is often necessary to transfer useful layers, optionally stressed, of small thickness (for example, between 20 nm and 500 nm).

According to an advantageous aspect of the invention, the sixth step E6 consists in transferring a useful layer 2 of thickness between 10 nm and 100 nm, from the donor substrate 3 to the receiver substrate 10.

Advantageously, a confinement layer with a thickness between 2 nm and 20 nm is used. The thinner the confinement layer, the more localized the break. For example, a confinement layer roughly 4 nm thick will confine the break in this zone.

In view of the small thickness of the confinement layer, it does not disturb, or disturbs very little, the lattice parameter of the donor substrate. This becomes relevant notably in the case in which the useful layer to be transferred is a stressed layer, which was increased in size.

In one embodiment, the confinement layer 4 consists of boron-doped silicon, and the ions 15 are introduced in the donor substrate 3 in a dose between $5 \times 10^{15}$ and $4 \times 10^{16}$ atoms/cm². Thus, the use of boron ions makes it possible to reduce the required ion implantation dose.

One application of the invention comprises the fabrication of FD-SOI. In the prior art, a useful layer of roughly 250 nm was to be transferred for fabricating such devices, whereas the method of the invention only requires a thickness of roughly 20 nm.

In one embodiment, a donor substrate with a plurality of stacked useful layers and confinement structures, for multiple transfers of useful layers, is used.

The donor substrate comprises a plurality of useful layers, composed of semiconductor material (optionally of different chemical compositions), and a plurality of confinement structures. The method comprises the step consisting in successively transferring at least part of each useful layer to a receiver substrate, in accordance with the steps of the method described above. In general, the receiver substrate is different for each useful layer to be transferred.

Thus, as illustrated in FIG. 7, the first useful layer 2" is transferred in accordance with the method of the invention to a first receiver substrate. Then, the multilayer donor substrate 3 is cleaned and polished to remove the remainder of the remaining layers. Next, the second useful layer 2' is transferred in accordance with the method of the invention to a second receiver substrate. Finally, the transfer method is repeated with the third useful layer 2.

An example of one such donor substrate 3 is illustrated in FIG. 7, comprising:

a useful layer 2 associated with a confinement structure 5 composed of a confinement layer 4 and protective layers 6, 7, and, as the case may be, separation layers arranged between the confinement layer 4 and the protective layers 6, 7;

a useful layer 2' associated with a confinement structure 5' composed of a confinement layer 4' and protective layers 6', 7', and, as the case may be, separation layers;

a useful layer 2" associated with a confinement structure 5" composed of a confinement layer 4" and protective layers 6", 7", and, as the case may be, separation layers.

The protective layers may or may not be in contact with the confinement layer, depending on whether the separation layers are present or not, as explained in the embodiment in relation to FIG. 2.

As it is understood, the invention has numerous advantages.

The invention notably makes it possible to transfer useful layers with reduced roughness.

Moreover, the invention makes it possible to transfer thin layers of a donor substrate to a receiver substrate.

Moreover, the invention makes it possible to facilitate the finishing of the donor substrate and/or the receiver substrate, notably by virtue of the reduction in the roughness of the useful layer, and by virtue of the use of protective layers enabling selective chemical etching in relation to the adjacent layers.

Lastly, the invention applies to the transfer of many different useful layers, notably stressed useful layers.

What is claimed is:

1. A method for transferring a layer of semiconductor material, which comprises:
    providing a donor substrate comprising a useful layer of a semiconductor material, a confinement structure comprising a confinement layer of a semiconductor material that has a chemical composition that is different from that of the useful layer, two separation layers of semiconductor material having a chemical composition distinct from a composition of the confinement layer, a first separation layer of the two separation layers arranged on and in contact with a first side of the confinement layer and a second separation layer of the two separation layers arranged on and in contact with a second side of the confinement layer, and two protective layers of semiconductor material having the same chemical composition as one another and a chemical composition that is distinct from that of the confinement layer, with a first protective layer of the two protective layers being arranged on and in contact with the first separation layer, and a second protective layer of the two protective layers being arranged on and in contact with the second separation layer;
    providing a receiver substrate;
    introducing ions into the donor substrate;
    bonding together the donor and receiver substrates;
    subjecting the donor and receiver substrates to a heat treatment that includes an increase in temperature, during which heat treatment the confinement layer is heated sufficiently and attracting and concentrating the ions in the confinement layer; and
    detaching the donor substrate from the receiver substrate by breaking at the confinement layer, and transferring at least part of the useful layer to the receiver substrate, with the two protective layers confining in the confinement structure defects that would otherwise appear following breaking at the confinement layer, the two separation layers preventing detachment inside the two protective layers.

2. The method of claim 1, wherein the confinement layer has a thickness in a range extending from 2 nm to 20 nm.

3. The method of claim 1, further comprising selecting the chemical composition of the two protective layers to be one which, during heat treatment, assists in attracting ions to the confinement layer.

4. The method of claim 1, wherein at least one of the two protective layers is in contact with the useful layer, and which further comprises:
    selecting the semiconductor material of the two protective layers in contact with the useful layer to be a material that enables selective chemical etching of the at least one of the two protective layers with respect to the useful layer; and
    selectively etching the at least one of the two protective layers after detachment of the donor substrate from the receiver substrate.

5. The method of claim 1, which further comprises:
    providing the donor substrate with a support layer in contact with the confinement structure, wherein at least one of the two protective layers is in contact with the support layer, and;
    selecting the semiconductor material of the two protective layers to be a material that enables selective chemical etching of the at least one of the two protective layers with respect to the support layer; and
    selectively etching the at least one of the two protective layers after detachment of the donor substrate from the receiver substrate.

6. The method of claim 1, wherein the introduction of ions into the donor substrate is carried out by immersion of the donor substrate in a plasma of the ions.

7. The method of claim 1, wherein the introduction of ions into the donor substrate is carried out by implantation of the ions.

8. The method of claim 1, wherein the confinement layer is boron-doped silicon, and wherein the ions are introduced into the donor substrate by implantation at a dose of between $5 \times 10^{15}$ and $4 \times 10^{16}$ atoms/cm$^2$.

9. The method of claim 1, which further comprises transferring a thickness of between 10 nm and 100 nm of the useful layer from the donor substrate to the receiver substrate.

10. The method of claim 1, wherein the donor substrate includes a plurality of groups of stacked layers, with each group of stacked layers of the plurality comprising a useful layer composed of a semiconductor material and a confinement structure, which method further comprises transferring successively at least part of each useful layer to a receiver substrate.

11. The method of claim 1, further comprising selecting the two protective layers to be of the same $Si_{(1-x)}Ge_x$ material, and selecting the confinement layer to be one of $Si_{(1-y)}Ge_y$, with x and y differing by greater than or equal to 3%, boron-doped SiGe, and boron-doped silicon.

12. The method of claim 1, wherein:
the two protective layers are the same chemical composition of a SiGe material and the confinement layer is boron-doped SiC;
the two protective layers are the same chemical composition of a SiGe material and the confinement layer is boron-doped Ge;
the two protective layers are InGaN and the confinement layer is an alloy of GaN and Si; or
the two protective layers are AlGaN and the confinement layer is undoped or Si-doped or Mg-doped InGaN.

13. The method of claim 1, wherein introducing ions into the donor substrate comprises introducing ions into the donor substrate at at least some distance from the two protective layers.

14. The method of claim 1, wherein providing two separation layers of semiconductor material comprises selecting the two separation layers to have thicknesses to accommodate an ion introduction profile of the ions to be introduced into the donor substrate such that an amount of ions are introduced and trapped at interfaces of the two protective layers and the two separations layers will not cause a breaking wave at the interfaces or within the two protective layers.

15. A method for transferring a layer of semiconductor material, which comprises:
providing a donor substrate comprising a useful layer of a semiconductor material, a confinement structure comprising a confinement layer of a semiconductor material that has a chemical composition that is different from that of the useful layer, two separation layers of semiconductor material having a chemical composition distinct from a composition of the confinement layer, a first separation layer of the two separation layers arranged on and in contact with a first side of the confinement layer and a second separation layer of the two separation layers arranged on and in contact with a second side of the confinement layer, and two protective layers of semiconductor material having a chemical composition that is distinct from that of the confinement layer, with a first protective layer of the two protective layers arranged on and in contact with the first separation layer, and a second protective layer of the two protective layers arranged on and in contact with the second separation layer;
introducing ions into the donor substrate;
bonding together the donor substrate and a receiver substrate;
subjecting the donor and receiver substrates to a heat treatment that includes an increase in temperature, during which heat treatment the confinement layer is heated sufficiently to attract and concentrate the ions in the confinement layer; and
detaching the donor substrate from the receiver substrate by breaking at the confinement layer, and transferring at least part of the useful layer to the receiver substrate, with the two protective layers confining in the confinement structure defects that would otherwise appear following breaking at the confinement layer, the two separation layers preventing detachment inside the two protective layers,
wherein the composition of each protective layer of the two protective layers is the same $Si_{(1-x)}Ge_x$ material, and the confinement layer is boron-doped SiGe or boron-doped silicon.

16. A method for transferring a layer of semiconductor material, which comprises:
providing a donor substrate comprising a useful layer of a semiconductor material, a confinement structure comprising a confinement layer of a semiconductor material that has a chemical composition that is different from that of the useful layer, two separation layers of semiconductor material having a chemical composition distinct from a composition of the confinement layer, a first separation layer of the two separation layers arranged on and in contact with a first side of the confinement layer and a second separation layer of the two separation layers arranged on and in contact with a second side of the confinement layer, and two protective layers of semiconductor material having a chemical composition that is distinct from that of the confinement layer, with a first protective layer of the two protective layers arranged on and in contact with the first separation layer, and a second protective layer of the two protective layers arranged on and in contact with the second separation layer;
introducing ions into the donor substrate;
bonding together the donor substrate and a receiver substrate;
subjecting the donor and receiver substrates to a heat treatment that includes an increase in temperature, during which heat treatment the confinement layer is heated sufficiently to attract and concentrate the ions in the confinement layer; and
detaching the donor substrate from the receiver substrate by breaking at the confinement layer, and transferring at least part of the useful layer to the receiver substrate, with the two protective layers confining in the confinement structure defects that would otherwise appear following breaking at the confinement layer, the two separation layers preventing detachment inside the two protective layers,
wherein:
the compositions of the two protective layers are the same SiGe material and the confinement layer is boron-doped SiC;
the compositions of the two protective layers are the same SiGe material and the confinement layer is boron-doped Ge;
the two protective layers are InGaN and the confinement layer is an alloy of GaN and Si; or
the two protective layers are AlGaN and the confinement layer is undoped InGaN, Si-doped InGaN, or Mg-doped InGaN.

* * * * *